United States Patent [19]
Fujita et al.

[11] Patent Number: 6,034,578
[45] Date of Patent: Mar. 7, 2000

[54] SURFACE ACOUSTIC WAVE DEVICE WITH CLOSELY SPACED DISCHARGE ELECTRODES ELECTRICALLY INDEPENDENT OF THE INTERDIGITAL TRANSDUCERS

[75] Inventors: Yuji Fujita; Norio Hosaka; Misao Nakajima, all of Iwate-ken, Japan

[73] Assignee: Hitachi Media Electronics Co., Ltd., Iwate-ken, Japan

[21] Appl. No.: 09/265,958

[22] Filed: Mar. 11, 1999

[30] Foreign Application Priority Data

Sep. 11, 1998 [JP] Japan .................................. 10-258671

[51] Int. Cl.⁷ .............................. H03H 9/64; H03H 3/08
[52] U.S. Cl. .................... 333/193; 333/195; 310/313 B; 310/313 D
[58] Field of Search .................................. 333/193–196; 310/313 R, 313 C, 313 D

[56] References Cited

U.S. PATENT DOCUMENTS

| | | | |
|---|---|---|---|
| 5,243,249 | 9/1993 | Miyashita et al. | 333/195 X |
| 5,325,573 | 7/1994 | Miyashita et al. | 333/195 X |
| 5,619,175 | 4/1997 | Bauregger | 333/195 |
| 5,701,645 | 12/1997 | Allen et al. | 333/193 X |
| 5,889,446 | 3/1999 | Yamada et al. | 333/193 |

FOREIGN PATENT DOCUMENTS

| | | |
|---|---|---|
| 60-240207 | 11/1985 | Japan . |
| 3-128518 | 5/1991 | Japan ..................................... 333/195 |
| 4-35312 | 2/1992 | Japan . |
| 4-243311 | 8/1992 | Japan . |
| 4-371009 | 12/1992 | Japan . |
| 6-132758 | 5/1994 | Japan . |
| 6-204779 | 7/1994 | Japan . |
| 6-350380 | 12/1994 | Japan . |
| 8-167826 | 6/1996 | Japan . |

*Primary Examiner*—Robert Pascal
*Assistant Examiner*—Barbara Summons
*Attorney, Agent, or Firm*—Evenson, McKeown, Edwards & Lenahan, PLLC

[57] ABSTRACT

A surface acoustic wave device which comprises: a plurality of interdigital transducers formed on a surface acoustic wave substrate; and a plurality of thin film electrodes disposed between the interdigital transducers and an end surface of the surface acoustic wave substrate and electrically independently of the interdigital transducers, at least one of distances between adjacent ones of the thin film electrodes being set to be smaller than a distance between the thin film electrodes and the interdigital transducers, so that the electrical performance of the device as well as the insulation resistance does not deteriorate, and the interdigital transducers can be prevented from being electrostatically broken.

4 Claims, 7 Drawing Sheets

SURFACE ACOUSTIC WAVE DEVICE WITH CLOSELY SPACED DISCHARGE ELECTRODES ELECTRICALLY INDEPENDENT OF THE INTERDIGITAL TRANSDUCERS

BACKGROUND OF THE INVENTION

1. Field of the Invention

The present invention relates to a surface acoustic wave device, and particularly to a surface acoustic wave device for use in a comparatively high frequency area in a radio communication system or the like.

2. Description of the Related Art

In a manufacturing process of such a surface acoustic wave device, there is a case where interdigital transducers may be electrostatically broken by heating applied when a piezoelectric substrate is bonded to a package, or by temperature rising generated when a cap is welded, or the like. This electrostatic break is caused by pyro-electricity of the piezoelectric substrate. To prevent this, there is such a proposal as disclosed, for example, in JP-A-6-224682.

In this proposal, electrostatically breaking sacrificial electrodes are provided at part of input and output electrodes, so that these sacrificial electrodes are electrostatically broken actively to thereby prevent excitation portions of the input and output electrodes from being eliminated.

It is also well known that to cover a surface of a piezoelectric substrate with a thin film electrode as wide as possible is effective, because charges due to spontaneous polarization caused by pyro-electricity are accumulated in a free surface where the substrate surface is not short-circuited.

However, since the electrostatically breaking sacrificial electrodes according to the above-mentioned publication are provided at part of input and output electrodes, there arises a problem that the frequency characteristic deteriorates because of electrostatic capacity of the electrostatically breaking sacrificial electrodes, particularly when they are used with a high frequency.

In addition, there arises a problem that, when the electrostatically breaking sacrificial electrodes are blown out by static electricity, melted electrode material deposits between the electrostatically breaking sacrificial electrodes to thereby reduce the insulation resistance at that place. Further, though rarely, the electrostatically breaking sacrificial electrodes are short-circuited by the melted electrode material. Since either one of the input and output electrodes is short-circuited at that time, there arises an extremely serious fault that high-frequency signals cannot pass there. In addition, even when the surface of the piezoelectric substrate is covered with a thin film electrode as wide as possible, there may be a case where electrostatic breaking of the interdigital transducers cannot be prevented.

Figure 5:
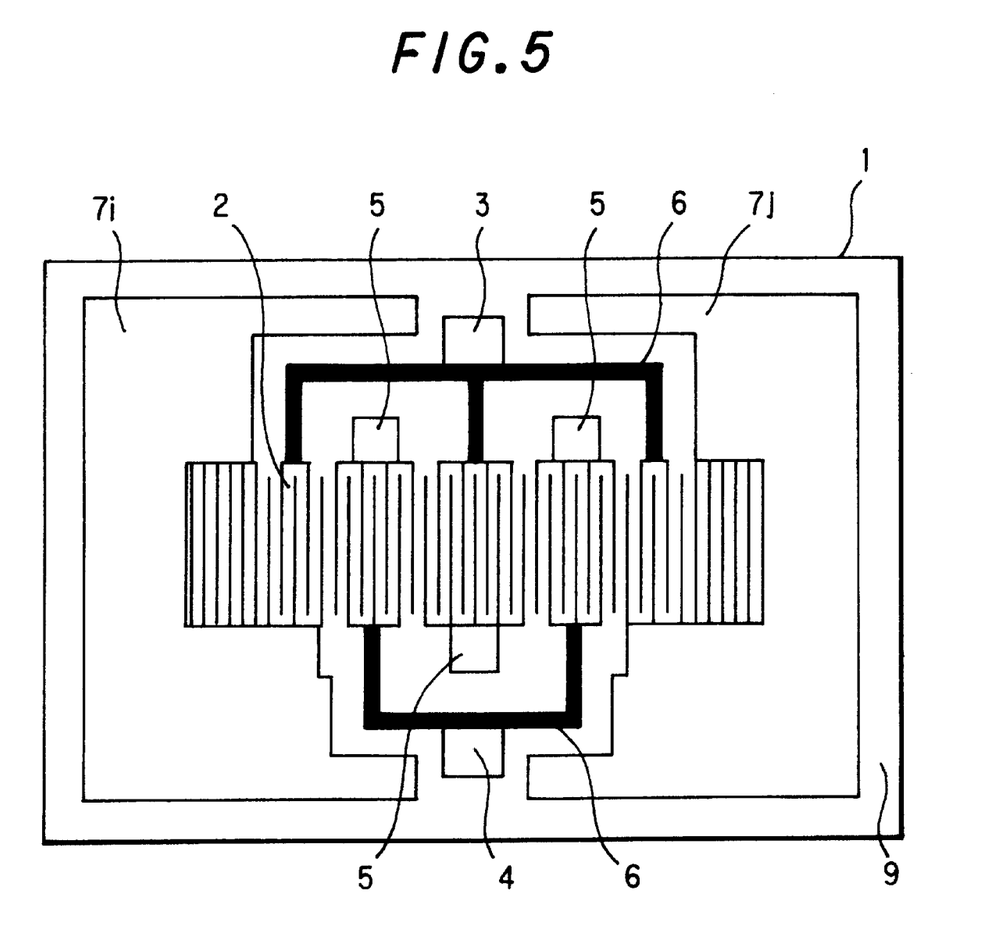
FIG. 5 is a plan view illustrating the configuration of a surface acoustic wave device in the background art.

FIG. 5 shows a surface acoustic wave device in the background art schematically. Input and output interdigital transducers 2 are formed on a piezoelectric substrate 1. These electrodes are connected to an input wire bonding pad 3 and an output wire bonding pad 4 through common electrodes 6. In addition, a ground bonding pad 5 is attached to each of the interdigital transducers 2. Thin film electrodes 7i and 7j for short-circuiting charges caused by spontaneous polarization are provided between these electrodes and the chip edge surface.

The thin film electrodes 7i and 7j are not formed to the edge surface of the piezoelectric substrate 1, but a dicing margin portion 9 is provided between the edge surface of the piezoelectric substrate 1 and the edges of the thin film electrodes 7i and 7j. This is because the interdigital transducers 2 are prevented from short-circuiting because of a broken piece produced by dicing a wafer to cut the piezoelectric substrate 1 out.

Although the surface acoustic wave device configured thus has an effect that the accumulation of electric charges due to spontaneous polarization can be restrained by the thin film electrodes 7i and 7j, the interdigital transducers 2 are still electrostatically broken. This is because the electric charges of spontaneous polarization generated in the dicing margin portion 9 which is the widest free surface in the piezoelectric substrate 1 is discharged into the interdigital transducers 2 through the thin film electrodes 7i and 7j.

Figure 6:
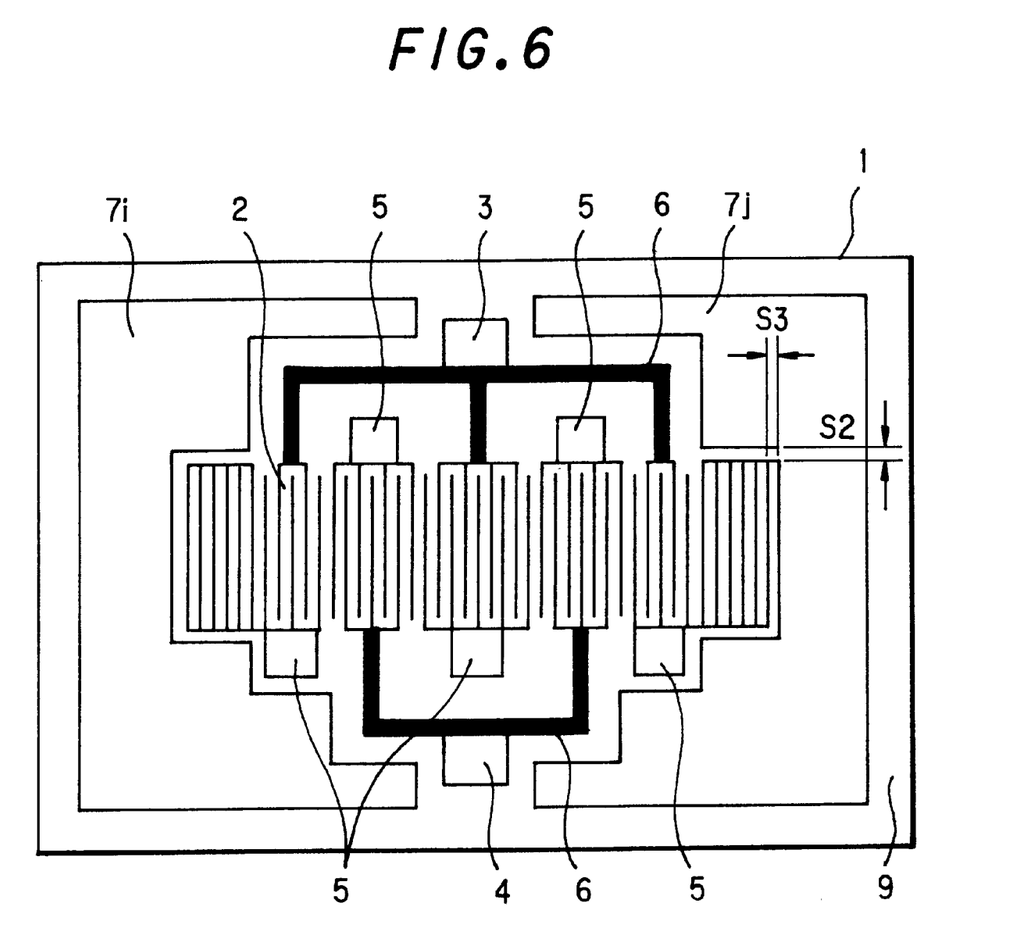
FIG. 6 is a plan view illustrating the configuration of the surface acoustic wave device in the background art.

To prevent this, it can be considered that spaces S2 and S3 are provided between the thin film electrodes 7i and 7j and the interdigital transducers 2 so as to prevent them from connecting to each other electrically, as shown in FIG. 6. High static electricity reaching the value of several kV may break the insulation of the spaces S2 and S3 to bring electrostatic breaking. Although the insulation is not broken if the spaces S2 and S3 are extended sufficiently, the free surface is widened by the spaces S2 and S3 so that the initial object cannot be attained.

SUMMARY OF THE INVENTION

It is therefore an object of the present invention to provide a surface acoustic wave device in which the electrical performance of the device as well as the insulation resistance does not deteriorate, and in which interdigital transducers can be prevented from being electrostatically broken.

In order to achieve the above object, according to an aspect of the present invention, provided is a surface acoustic wave device which comprises: a plurality of interdigital transducers formed on a surface acoustic wave substrate; and a plurality of thin film electrodes disposed between the interdigital transducers and an end surface of the surface acoustic wave substrate and electrically independently of the interdigital transducers, at least one of distances between adjacent ones of the thin film electrodes being set to be smaller than a distance between the thin film electrodes and the interdigital transducers.

Preferably, the thin film electrodes are made to be plane-shaped.

Preferably, each of the thin film electrodes has a plane portion, and at least one pair of discharge interdigital transducers are provided between the thin film electrodes.

Preferably, at least one of the thin film electrodes is grounded to a package through a bonding wire or a bump.

With the above-mentioned configuration, static electricity generated in the dicing margin portion, in which spontaneous polarization is easily generated, is not applied to the interdigital transducers, but discharged between the thin film electrodes. It is therefore possible to protect the input and output interdigital transducers from being broken.

DETAILED DESCRIPTION OF THE PREFERRED EMBODIMENTS

Figure 1:
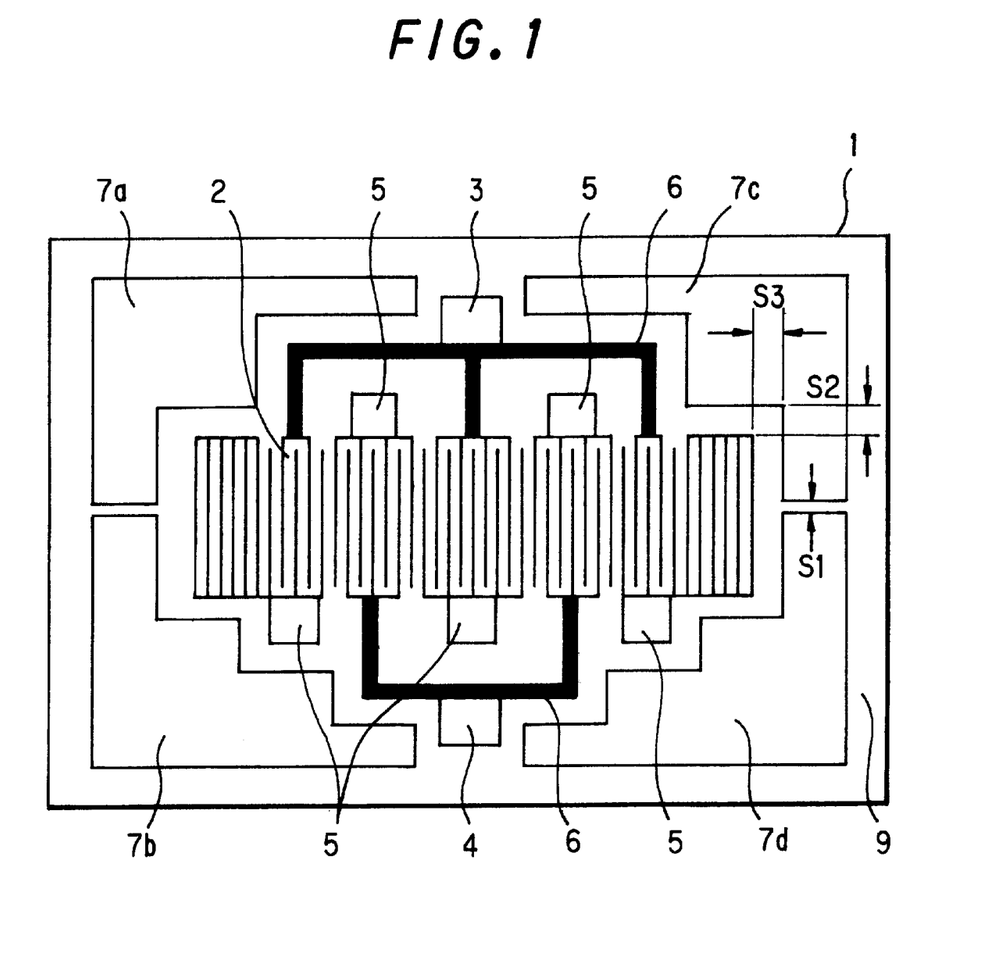
FIG. 1 is a plan view illustrating the configuration of a surface acoustic wave device according to a first embodiment of the present invention.

Embodiments of the present invention will be described below with reference to the drawings. FIG. 1 shows a configuration of electrodes according to a first embodiment. A 64-degree rotated Y-axis cut and X-axis propagation Lithium niobate is used for the piezoelectric substrate 1. Interdigital transducers 2, an input wire bonding pad 3, an output wire bonding pad 4, ground wire bonding pads 5, common electrodes 6, and thin film electrodes 7a, 7b, 7c and 7d are provided on the piezoelectric substrate 1 as show The thin film electrodes 7a, 7b, 7c and 7d are not connected to any of the interdigital transducers 2, the input wire bonding pad 3, the output wire bonding pad 4, the ground wire bonding pads 5, and the common electrodes 6. That is, the thin film electrodes 7a, 7b, 7c and 7d are electrically independently of the latter members. In addition, each of the spaces S1 between the thin film electrodes 7a and 7b and between 7c and 7d is selected to be 5 $\mu$m, while each of the spaces S2 and S3 between the thin film electrodes 7a, 7b, 7c and 7d and the interdigital transducers 2 is selected to be 30 $\mu$m. The width of the dicing margin portion is 100 $\mu$m.

Next, description will be made about the mechanism for preventing electrostatic breaking in the present invention. In the piezoelectric substrate 1, the generation of electric charges due to spontaneous polarization is not uniform, and the quantity of charge generation is largest in the dicing margin portion which is the widest free surface portion. The electric charges generated in the dicing margin portion are coupled with ions in the air and discharged gradually when the temperature changes gently. In the case where the electric charges are generated suddenly, the electric charges are discharged through the metal portion near the dicing margin portion.

In this embodiment, the space S1 is set to be narrower than each of the spaces S2 and S3 sufficiently, so that static electricity is discharged between the thin film electrodes 7a and 7b or between 7c and 7d selectively. Accordingly, there is no fear that the interdigital transducers 2 are subject to electrostatic breaking.

In such a manner, the thin film electrodes 7a, 7b, 7c and 7d, which cause electrostatic discharge actively, are provided electrically independently of the interdigital transducers 2 and other portions connected thereto. Accordingly, there is no fear that the thin film electrodes 7a, 7b, 7c and 7d give any influence on the high-frequency property and the insulation resistance property of the device.

Figure 2:
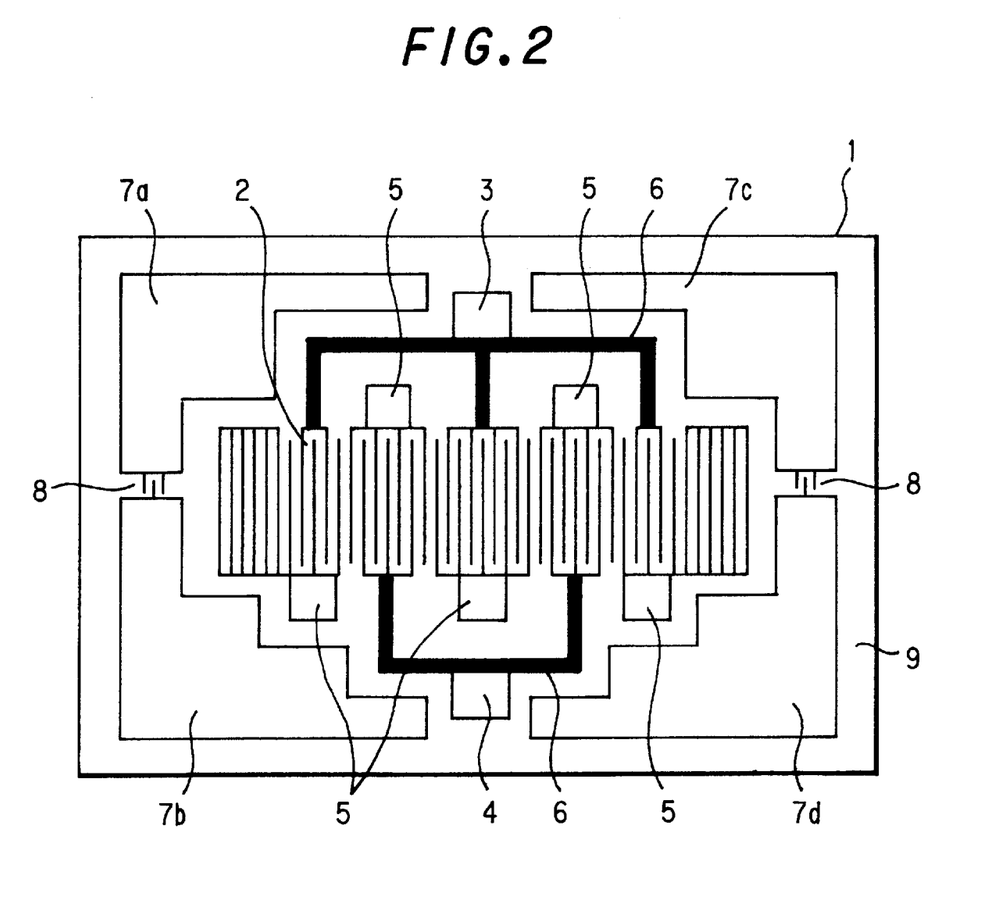
FIG. 2 is a plan view illustrating the configuration of a surface acoustic wave device according to a second embodiment of the present invention.

Next, a second embodiment of the present invention will be described with reference to FIG. 2. In addition to the configuration shown in FIG. 1, discharge interdigital transducers 8 are provided between the thin film electrodes 7a and 7b and between 7c and 7d in FIG. 2. The other portions are the same as those in the first embodiment of the present invention. The electrode width of the discharge interdigital transducer 8 and distance between the electrodes of the discharge interdigital transducer 8 are selected to be 1.0 and 0.7 $\mu$cm respectively, which are the same as those in the interdigital transducer 2. The number of pairs of the electrodes is selected to be three.

In this embodiment, electrostatic discharge is performed more smoothly because the discharge interdigital transducers 8 are provided. That is, with the same configuration as the interdigital transducers 2, the discharge interdigital transducers 8 can perform discharge even at a comparatively low charge voltage. Accordingly, it is possible to obtain a good effect in protection for the interdigital transducers 2.

Also in this embodiment, the thin film electrodes 7a to 7d and the discharge interdigital transducers 8 are provided electrically independently of the interdigital transducers 2 and other portions connected to the interdigital transducers 2. Accordingly, it is apparent that the thin film electrodes 7a to 7d and the discharge interdigital transducers 8 give no influence on the high-frequency performance and the insulation resistance performance of the device.

Although the electrode width and the distance between the electrodes of the discharge interdigital transducers 8 are the same as those of the interdigital transducers 2 in this embodiment, it is apparent that the former may be selected to be smaller than the latter. Even if the electrode width and the electrode distance of the discharge interdigital transducers 8 are selected to be larger than those of the interdigital transducers 2, a similar effect can be obtained so long as the aperture length of the electrodes is made small. Further, it is not always necessary to make the electrodes interdigitated but it may be made to be wedge-shaped with a sharp tip.

Figure 3:
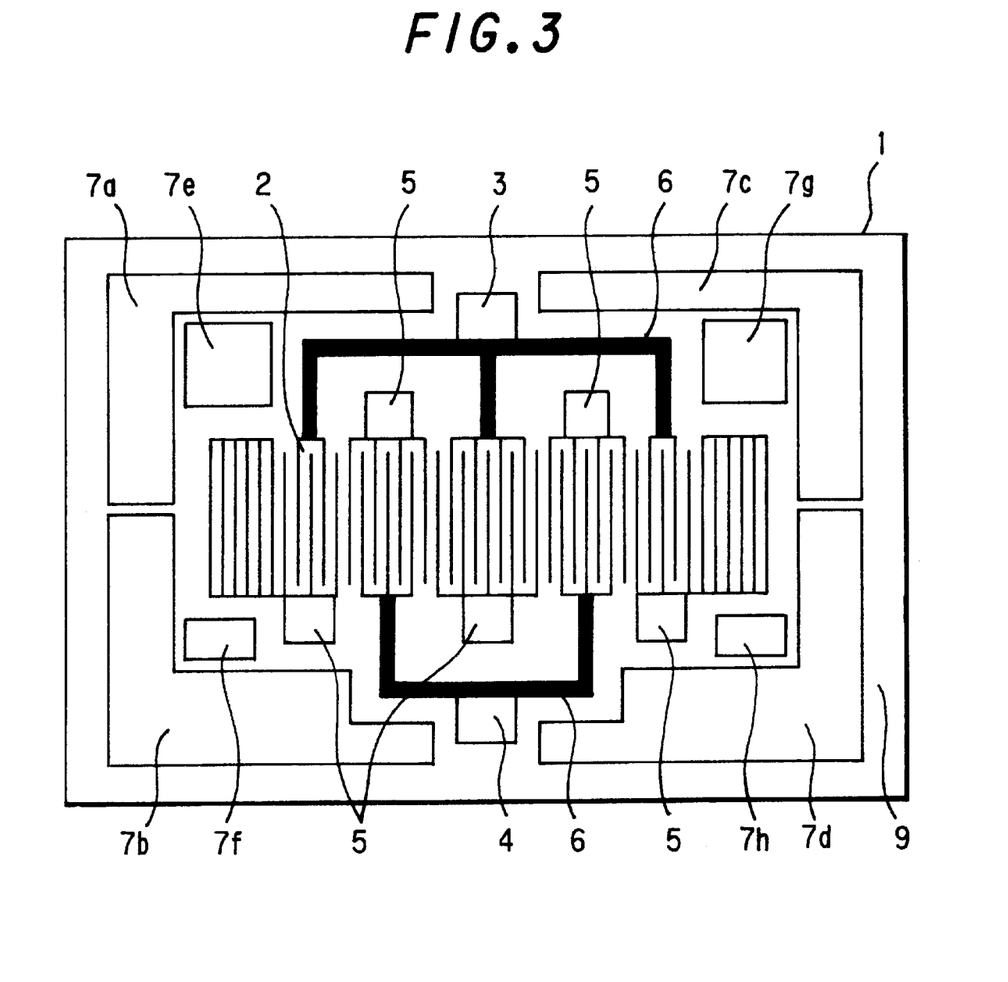
FIG. 3 is a plan view illustrating the configuration of a surface acoustic wave device according to a third embodiment of the present invention.

Next, a third embodiment of the present invention will be described with reference to FIG. 3. In FIG. 3, each of the thin film electrodes 7a, 7b, 7c and 7d is divided into two so that thin film electrodes 7e, 7f, 7g and 7h are formed in addition to the configuration shown in FIG. 1. The other portions are the same as those in the first embodiment of the present invention.

This embodiment has a feature that two kinds of thin film electrodes are provided between the interdigital transducers 2 and the dicing margin portion 9. Accordingly, the electric charges generated in the dicing margin portion 9 is discharged through the thin film electrodes 7a, 7b, 7c, 7d, 7e, 7f, 7g and 7h. It is therefore possible to obtain a good effect in prevention of electrostatic breaking.

That is, even if discharge cannot be made completely between the thin film electrodes 7a and 7b, discharge is further effected between the thin film electrodes 7a and 7e and between 7b and 7f. Accordingly, the effect to protect the interdigital transducers 2 is improved. Further, it is apparent that the effect can be further improved if the number of divisions of the thin film electrodes increases.

Figure 4:
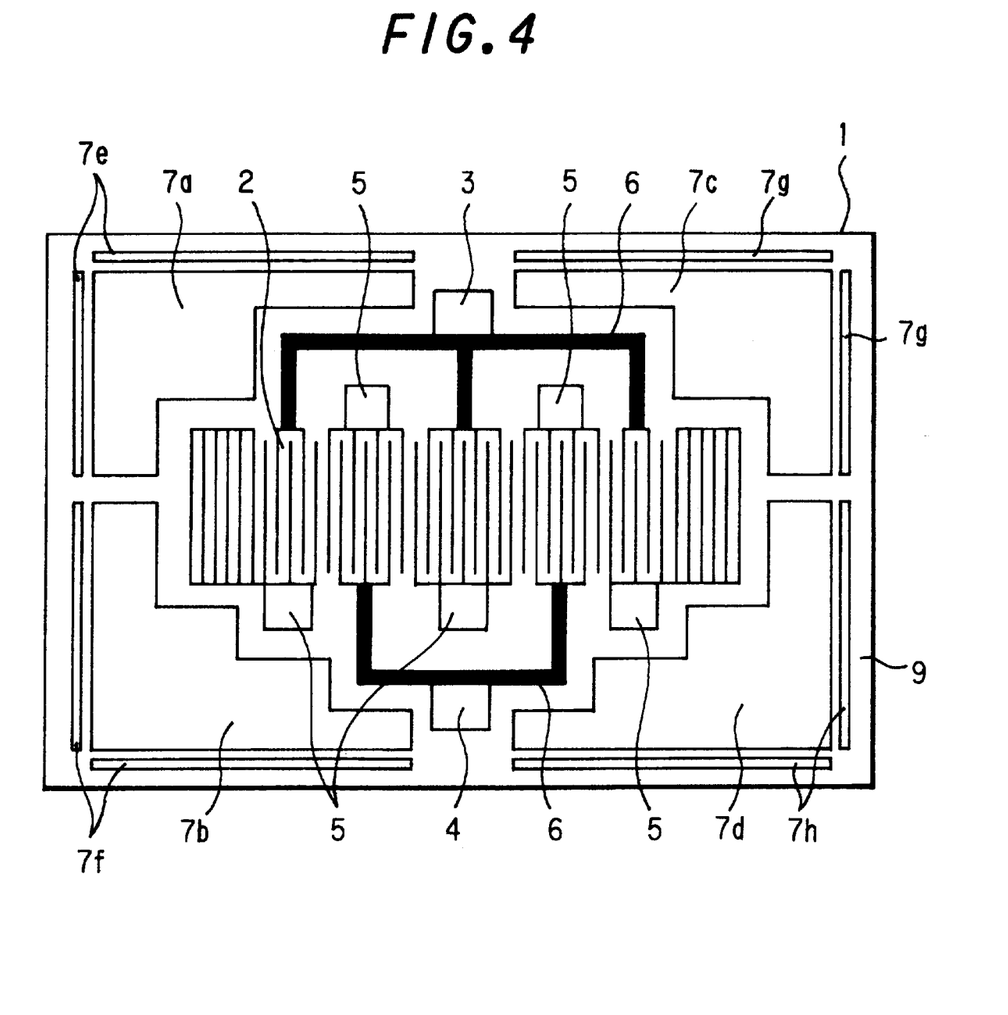
FIG. 4 is a plan view illustrating the configuration of a surface acoustic wave device according to a fourth embodiment of the present invention.

Next, a fourth embodiment of the present invention will be described with reference to FIG. 4. In FIG. 4, thin film electrodes 7e, 7f, 7g and 7h are added to the configuration shown in FIG. 1. The other portions are the same as those in the first embodiment of the present invention.

Although two kinds of thin film electrodes are provided between the interdigital transducers 2 and the dicing margin portion 9 in the same manner as in the third embodiment, this fourth embodiment has a feature that the thin film electrodes 7e, 7f, 7g and 7h are added to portions near the edges of the piezoelectric substrate 1. The operation in this fourth embodiment is the same as that in the third embodiment. However, in this embodiment, electrostatic discharge is performed in a portion near an edge portion of the piezoelectric substrate 1 sufficiently away from the interdigital transducers 2. Accordingly, electrode material blown by the discharge is collected in the edge portions of the piezoelectric substrate even if the electrode material adheres thereto again, so that there is no fear that the electrode material gives any bad influence on the interdigital transducers 2.

Figure 7:
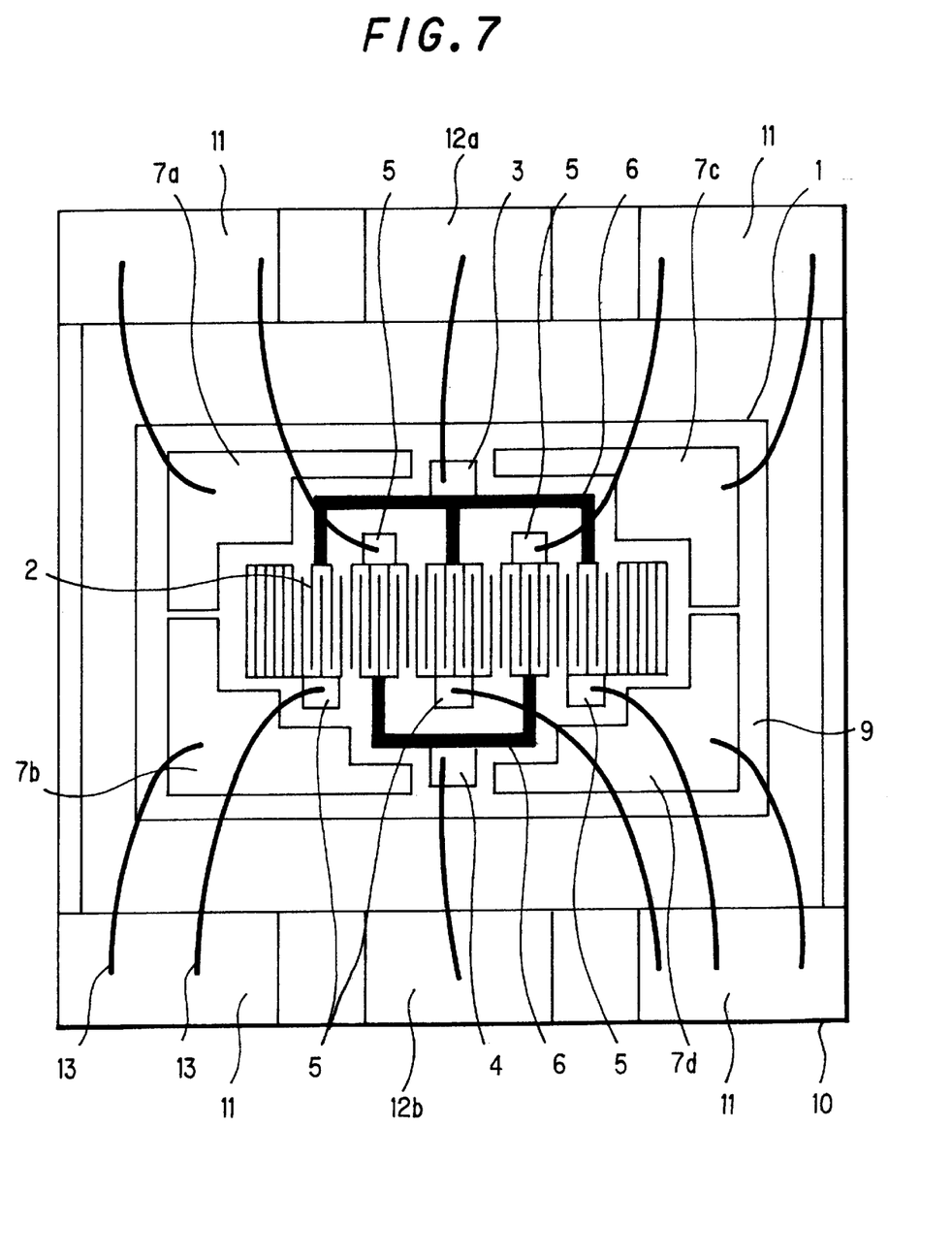
FIG. 7 is a plan view illustrating the configuration of a surface acoustic wave device according to a fifth embodiment of the present invention.

Next, a fifth embodiment of the present invention will be described with reference to FIG. 7. In FIG. 7, a package 10 and bonding wires 13 are added to the configuration shown in FIG. 1. The other portions are the same as those in the first embodiment of the present invention.

In this embodiment, the piezoelectric substrate 1 is fixed to the package 10 through a bonding agent (not shown) which is . As for the electrical connection to the package 10, an input terminal 12a is connected to the input bonding pad 3 through the boding wire 13, while an output terminal 12b is connected to the output bonding pad 4 through the bonding wire 13. In the same manner, ground terminals 11 are connected to the ground bonding pads 5 through the bonding wires 13, and the thin film electrodes 7a, 7b, 7c and 7d are connected to the ground terminals 11 through the bonding wires 13.

According to this embodiment, the thin film electrodes 7a, 7b, 7c and 7d do not float electrically, so that the electrical potential is stabilized. Accordingly, there is an effect to obtain sufficient reliability of the device even in a high frequency area.

Also in this case, the input and output bonding pads 3 and 4 for the interdigital transducers 2 and the thin film electrodes 7a, 7b, 7c and 7d are not connected electrically, that is, they are independent of one another. In the same manner as in the first embodiment, it is therefore apparent that the effect to restrict electrostatic breaking is not lost, and the electrical performance of the device is not lowered. It is not always necessary to connect the piezoelectric substrate 1 to the package 10 by means of the bonding wire 13, but it may be connected by means of a bump or the like.

As described above, according to the present invention, in a surface acoustic wave device, a plurality of thin film electrodes are disposed between a plurality of interdigital transducers and an end surface of a surface acoustic wave substrate and independently of the interdigital transducers, while at least one of distances between adjacent ones of the thin film electrodes is set to be smaller than the distance between the thin film electrodes and the interdigital transducers.

What is claimed is:

1. A surface acoustic wave device comprising:
    a plurality of interdigital transducers formed on a surface acoustic wave substrate; and
    a plurality of thin film electrodes disposed between said interdigital transducers and an end surface of said surface acoustic wave substrate and electrically independently of said interdigital transducers, at least one of distances between adjacent ones of said thin film electrodes being set to be smaller than a distance between said thin film electrodes and said interdigital transducers.

2. A surface acoustic wave device according to claim 1, wherein said thin film electrodes are made to be plane-shaped.

3. A surface acoustic wave device according to claim 1, wherein each of said thin film electrodes has a plane portion, and at least one pair of discharge interdigital transducers are provided between said thin film electrodes.

4. A surface acoustic wave device according to claim 1, wherein at least one of said thin film electrodes is grounded to a package through a bonding wire or a bump.

* * * * *